(12) United States Patent
Cho (10) Patent No.: US 9,454,194 B2
(45) Date of Patent: Sep. 27, 2016

(54) HEAT DISSIPATING MODULE CAPABLE OF ENHANCING HEAT DISSIPATING EFFICIENCY

(71) Applicant: Wistron Corporation, New Taipei (TW)

(72) Inventor: Shih-Huai Cho, New Taipei (TW)

(73) Assignee: Wistron Corporation, New Taipei (TW)

( * ) Notice: Subject to any disclaimer, the term of this patent is extended or adjusted under 35 U.S.C. 154(b) by 680 days.

(21) Appl. No.: 13/652,487

(22) Filed: Oct. 16, 2012

(65) Prior Publication Data

US 2013/0264029 A1    Oct. 10, 2013

(30) Foreign Application Priority Data

Apr. 5, 2012  (TW) .............................. 101112048 A (51) Int. Cl.
| | | |
|---|---|---|
| H05K 7/20 | (2006.01) | |
| G06F 1/20 | (2006.01) | |
| H01L 23/467 | (2006.01) | |
| H01L 23/40 | (2006.01) | |

(52) U.S. Cl.
CPC ............... G06F 1/20 (2013.01); H01L 23/467 (2013.01); H05K 7/20154 (2013.01); *H01L 23/4006* (2013.01); *H01L 2924/0002* (2013.01)

(58) Field of Classification Search
CPC ............... H05K 7/20; H05K 7/20145; H05K 7/20136; H05K 7/20154; H05K 7/20163; H05K 7/20181; H05K 7/20618; H01L 23/3675; H01L 23/467; F28F 7/00

USPC ................. 165/80.3, 100, 101, 103
See application file for complete search history.

(56) References Cited

U.S. PATENT DOCUMENTS

| | | | | |
|---|---|---|---|---|
| 5,913,360 A | * | 6/1999 | Stark | 165/66 |
| 6,484,755 B1 | * | 11/2002 | Schwarz | 137/637.3 |
| 7,111,667 B2 | * | 9/2006 | Chang | 165/80.3 |
| 7,349,212 B2 | * | 3/2008 | Xia et al. | 361/697 |
| 7,414,842 B2 | * | 8/2008 | Hao et al. | 361/697 |
| 7,548,422 B2 | * | 6/2009 | Hsieh | 361/695 |

(Continued)

FOREIGN PATENT DOCUMENTS

| | | |
|---|---|---|
| TW | M313276 | 6/2007 |
| TW | 200741428 | 11/2007 |
| TW | 201026211 | 7/2010 |

OTHER PUBLICATIONS

Office action mailed on Feb. 27, 2014 for the Taiwan application No. 101112048, filed: Apr. 5, 2012, p. 1 line 6-14, p. 2-6 and p. 7 line 1-24.

(Continued)

*Primary Examiner* — Travis Ruby
*Assistant Examiner* — Harry Arant
(74) *Attorney, Agent, or Firm* — Winston Hsu; Scott Margo (57) ABSTRACT

A heat dissipating module includes a heat dissipating member and an air flow guiding mechanism. The air flow guiding mechanism includes a base, an air guiding plate and a stopping structure. The base is disposed on a side of the heat dissipating member, and the air guiding plate is pivoted to the base. The stopping structure is disposed on the base. A side of the stopping structure abuts against the air guiding plate, so as to allow the air guiding plate to rotate in a first direction and to stop the air guiding plate from rotating in a second direction opposite to the first direction.

18 Claims, 7 Drawing Sheets

(56) References Cited

U.S. PATENT DOCUMENTS

| | | | |
|---|---|---|---|
| 8,448,695 B2 * | 5/2013 | Tang | G06F 1/20 165/78 |
| 2003/0230396 A1 * | 12/2003 | Weintraub et al. | 165/55 |
| 2004/0188063 A1 | 9/2004 | Chang | |
| 2008/0019094 A1 | 1/2008 | Xia | |
| 2010/0071875 A1 | 3/2010 | Hwang | |
| 2010/0288475 A1 * | 11/2010 | Cao | 165/121 |
| 2011/0232880 A1 | 9/2011 | Tang | |

OTHER PUBLICATIONS

Office action mailed on Apr. 1, 2015 for the China application No. 201210122254.1, p. 3 line 4-43, p. 4-7 and p. 8 line 1-29.

* cited by examiner

HEAT DISSIPATING MODULE CAPABLE OF ENHANCING HEAT DISSIPATING EFFICIENCY

BACKGROUND OF THE INVENTION

1. Field of the Invention

The present disclosure relates to a heat dissipating module, and more particularly, to a heat dissipating module adapted to different electronic devices and capable of enhancing heat dissipating efficiency.

2. Description of the Prior Art

An electronic device is equipped with a fan in general for generating an air flow therein, so as to dissipate heat generated by internal electronic components of the electronic device. Accordingly, the internal electronic components can function normally with an adequate temperature. Since there is a trend for the electronic device to have designs of light weight, thin thickness, short and small size, a certain internal electronic component, such as an automatic voltage regulator, is often located on a lee side of another electronic component relative to the fan. In other words, the certain internal electronic component is often disposed in a position where the air flow is hard to achieve. As a result, the heat generated by the certain internal electronic component can not be dissipated in time, so as to reduce heat dissipating efficiency and to further result in abnormal functioning.

A conventional solution to solve above drawbacks is to dispose an additional air guiding plate for guiding air to the certain internal electronic component, so as to cool the certain internal electronic component by convection. However, the conventional air guiding plate is a fixed structural design, i.e. the conventional air guiding plate can not be adjusted with respect to different electronic devices. In other words, the conventional air guiding plate with the fixed structural design can only be adapted to a specific electronic device, i.e. it needs different air guiding plates for implementation of the different electronic devices. In such a manner, the conventional air guiding plate lacks for compatibility and further results in disadvantaging manufacture.

SUMMARY OF THE INVENTION

Thus, the present disclosure relates to a heat dissipating module adapted to different electronic devices and capable of enhancing heat dissipating efficiency for solving above drawbacks.

According to the claimed invention, a heat dissipating module capable of enhancing heat dissipating efficiency includes a first heat dissipating member, a second heat dissipating member, a first air flow guiding mechanism and a second air flow guiding mechanism. The second heat dissipating member is aligned with the first heat dissipating member. The first air flow guiding mechanism includes a first base, a first air guiding plate and a first stopping structure. The first base is disposed on a side of the first heat dissipating member. The first air guiding plate is pivoted to the first base. The first stopping structure is disposed on the first base, and a side of the first stopping structure abuts against the air guiding plate, so as to allow the first air guiding plate to rotate in a first direction and to prevent the first air guiding plate from rotating in a second direction opposite to the first direction. The second air flow guiding mechanism includes a second base, a second air guiding plate and a second stopping structure. The second base is disposed on a side of the second heat dissipating member far from the first heat dissipating member. The second air guiding plate is pivoted to the second base. The second stopping structure is disposed on the second base, and a side of the second stopping structure abuts against the air guiding plate, so as to allow the second air guiding plate to rotate in a second direction and to prevent the second air guiding plate from rotating in the first direction.

According to the claimed invention, each of the first air guiding plate and the second air guiding plate comprises a first air driven section and a second air driven section. The first air flow guiding mechanism further comprises a first pivotal member disposed at a joint where the first air driven section of the first air guiding plate is combined with the second air driven section of the first air guiding plate for pivoting the first air guiding plate to the first base. The second air flow guiding mechanism further comprises a second pivotal member disposed at a joint where the first air driven section of the second air guiding plate is combined with the second air driven section of the second air guiding plate for pivoting the second air guiding plate to the second base.

According to the claimed invention, a side of the first stopping structure far from the first heat dissipating member abuts against the second air driven section of the first air guiding plate, and a side of the second stopping structure far from the second heat dissipating member abuts against the second air driven section of the second air guiding plate.

According to the claimed invention, a length of the first air driven section is greater than a length of the second air driven section.

According to the claimed invention, the first pivotal member and the first air guiding plate are integrally formed, and the second pivotal member and the second air guiding plate are integrally formed.

According to the claimed invention, the first base comprises a first hook for hooking the first heat dissipating member, and the second base comprises a second hook for hooking the second heat dissipating member.

According to the claimed invention, the heat dissipating module further includes a screw component for respectively screwing the first heat dissipating member and the second heat dissipating member onto a circuit board.

According to the claimed invention, the heat dissipating module further includes a fixing plate for respectively fixing the first heat dissipating member and the second heat dissipating member onto a corresponding electronic component.

According to the claimed invention, the first heat dissipating member and the second heat dissipating member are respectively a thermal fin.

According to the claimed invention, the first air guiding plate and the second air guiding plate are respectively made of Nylon 66 materials.

According to the claimed invention, a heat dissipating module capable of enhancing heat dissipating efficiency includes a first heat dissipating member, a second heat dissipating member, a first air flow guiding mechanism and a second air flow guiding mechanism. The second heat dissipating member is not aligned with the first heat dissipating member. The first air flow guiding mechanism includes a first base, a first air guiding plate and a first stopping structure. The first base is disposed on a side of the first heat dissipating member. The first air guiding plate is pivoted to the first base. The first stopping structure is disposed on the first base, and a side of the first stopping structure abuts against the air guiding plate, so as to allow the first air guiding plate to rotate in a first direction and to prevent the first air guiding plate from rotating in a second direction opposite to the first direction. The second air flow guiding mechanism includes a second base, a second air guiding plate and a second stopping structure. The second base is disposed on a side of the second heat dissipating member far from the first heat dissipating member. The second air guiding plate is pivoted to the second base. The second stopping structure is disposed on the second base, and a side of the second stopping structure abuts against the air guiding plate, so as to allow the second air guiding plate to rotate in a second direction and to prevent the second air guiding plate from rotating in the first direction.

In summary, since the side of the first stopping structure far from the first heat dissipating member abuts against the second air driven section of the first air guiding plate, the first air guiding plate of the present disclosure is capable of freely rotating in the first direction and incapable of rotating in the second direction. Since the side of the second stopping structure far from the second heat dissipating member abuts against the second air driven section of the second air guiding plate, the second air guiding plate of the present disclosure is capable of freely rotating in the second direction and incapable of rotating in the first direction. When air emitted from a fan passes the heat dissipating module of the present disclosure in a direction from the first heat dissipating member toward the second heat dissipating member, the first air guiding plate is rotated in the first direction, such that the air passes through the first air guiding plate and achieves the second air guiding plate. Additionally, since the second air guiding plate is incapable of rotating in the first direction, the air can not pass through the second air guiding plate and thus is guided to an electronic component disposed underneath the second air guiding mechanism, i.e. on a lee side of another electronic component relative to the fan, so as to enhance the heat dissipating efficiency.

These and other objectives of the present disclosure will no doubt become obvious to those of ordinary skill in the art after reading the following detailed description of the embodiment that is illustrated in the various figures and drawings.

DETAILED DESCRIPTION

Figure 1:
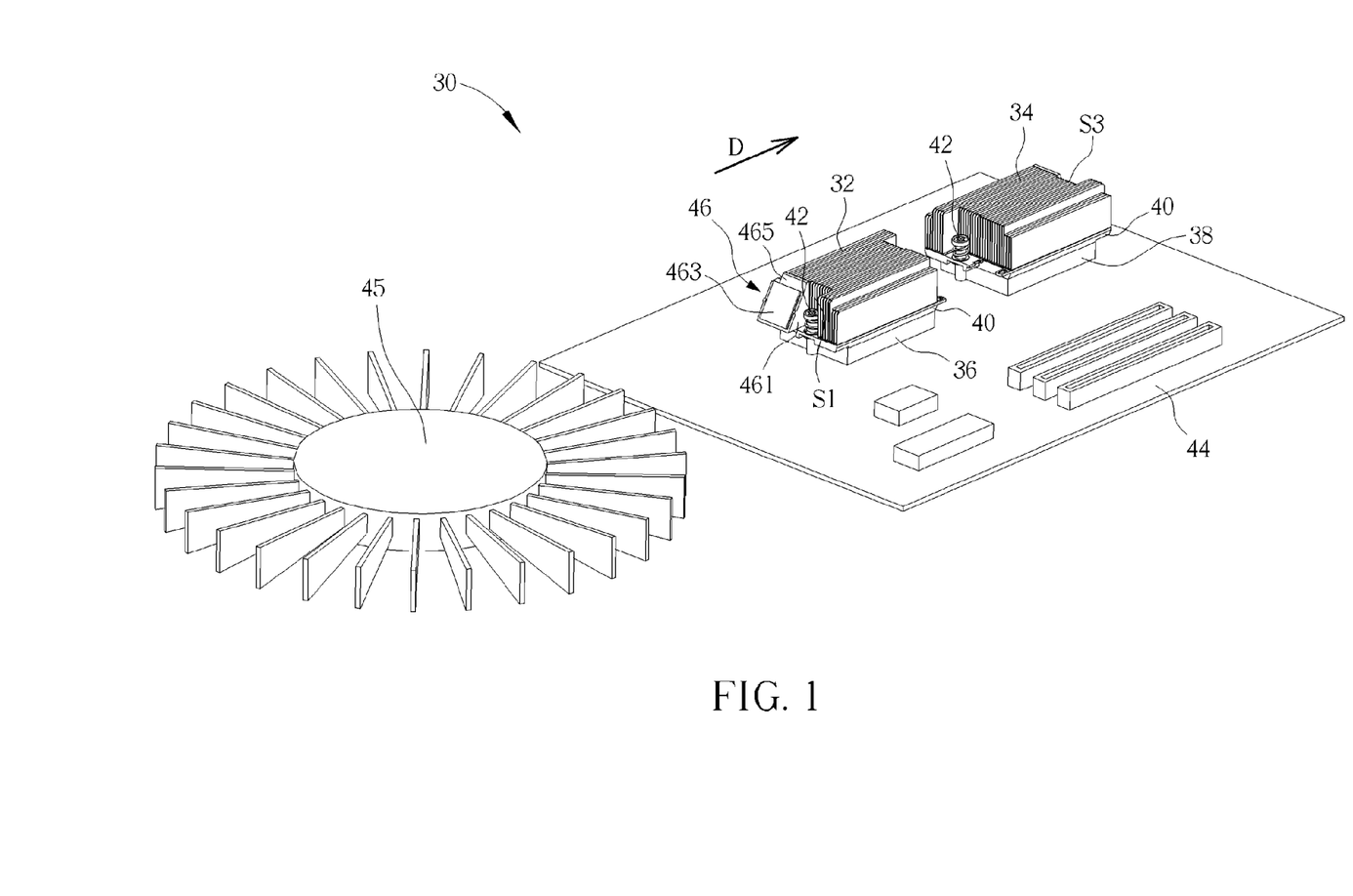
FIG. 1 is a diagram of a heat dissipating module according to a first embodiment of the present invention.
Figure 2:
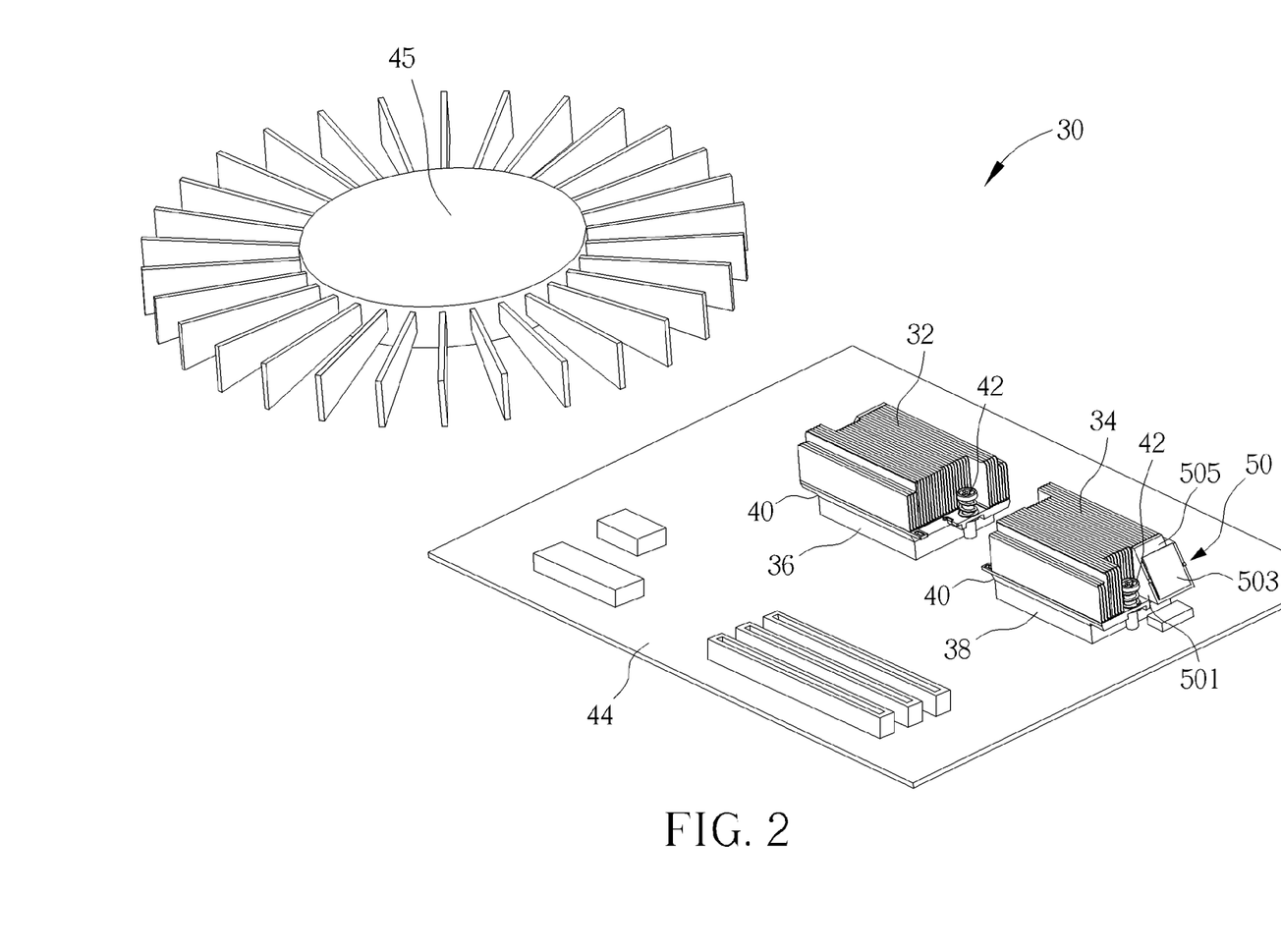
FIG. 2 is a diagram of the heat dissipating module in another view according to the first embodiment of the present invention.

Please refer to FIG. 1 and FIG. 2. FIG. 1 is a diagram of a heat dissipating module 30 according to a first embodiment of the present invention. FIG. 2 is a diagram of the heat dissipating module 30 in another view according to the first embodiment of the present invention. As shown in FIG. 1 and FIG. 2, the heat dissipating module 30 includes a first heat dissipating member 32 and a second heat dissipating member 34. The second heat dissipating member 34 can be substantially aligned with the first heat dissipating member 32, and the first heat dissipating member 32 and the second heat dissipating member 34 can be installed on the a first electronic component 36 and a second electronic component 38, respectively. Accordingly, the first heat dissipating member 32 and the second heat dissipating member 34 can be used for respectively dissipating heat generated by the running first electronic component 36 and the running second electronic component 38, such that the first electronic component 36 and the second electronic component 38 function normally with an adequate temperature. In this embodiment, the first electronic component 36 and the second electronic component 38 can be respectively a Central Processing Unit (CPU) of an electronic device, and the first heat dissipating member 32 and the second heat dissipating member 34 can be respectively a thermal fin which can be used for dissipating the heat generated by the aforesaid Central Processing Units. In other words, the heat dissipating module 30 of the present disclosure can be adapted to an electronic device with two or more Central Processing Units, such as a desk top computer device, a server computer device and so on.

Furthermore, the heat dissipating module 30 further includes a fixing plate 40 for fixing the first heat dissipating member 32 and the second heat dissipating member 34 onto the first electronic component 36 and the second electronic component 38, respectively. In practical application, the fixing plate 40 can be covered by thermal grease for intensively dissipate the heat generated by the running first electronic component 36 and the running second electronic component 38 to the first heat dissipating member 32 and the second heat dissipating member 34, so as to enhance the heat dissipating efficiency of the heat dissipating module 30.

In addition, the heat dissipating module 30 further includes a screw component 42 for screwing the first heat dissipating member 32 and the second heat dissipating member 34 onto a circuit board 44, respectively. In this embodiment, the circuit board 44 can be a main board. In such a manner, the screw component 42 can provide the first heat dissipating member 32 and the second heat dissipating member 34 with a normal press for keeping the first heat dissipating member 32 and the first electronic component 36 as well as the second heat dissipating member 34 and the second electronic component 38 with a tight contact, so as to enhance heat conductivity between the first heat dissipating member 32 and the first electronic component 36 as well as the second heat dissipating member 34 and the second electronic component 38. Accordingly, it can enhance the heat dissipating efficiency of the heat dissipating module 30. In this embodiment, the heat dissipating module 30 can include four screw components 42. Two of the four screw components 42 are respectively screwed on two sides of the first heat dissipating member 32, and the other two of the four screw components 42 are respectively screwed on two sides of the second heat dissipating member 34, as shown in FIG. 1 and FIG. 2. An amount and disposal positions of the screw component 42 are not limited to those mentioned in this embodiment, and it depends on practical demands. Additionally, the electronic device can include a fan 45 for generating an air flow therein for strengthening the first heat dissipating member 32 and the second heat dissipating member 34 to dissipate the heat generated by the running first electronic component 36 and the running second electronic component 38 on the circuit board 44 by convection. In this embodiment, the fan 45 can be located on a position corresponding to a first side S1 of the first heat dissipating member 32.

Figure 3:
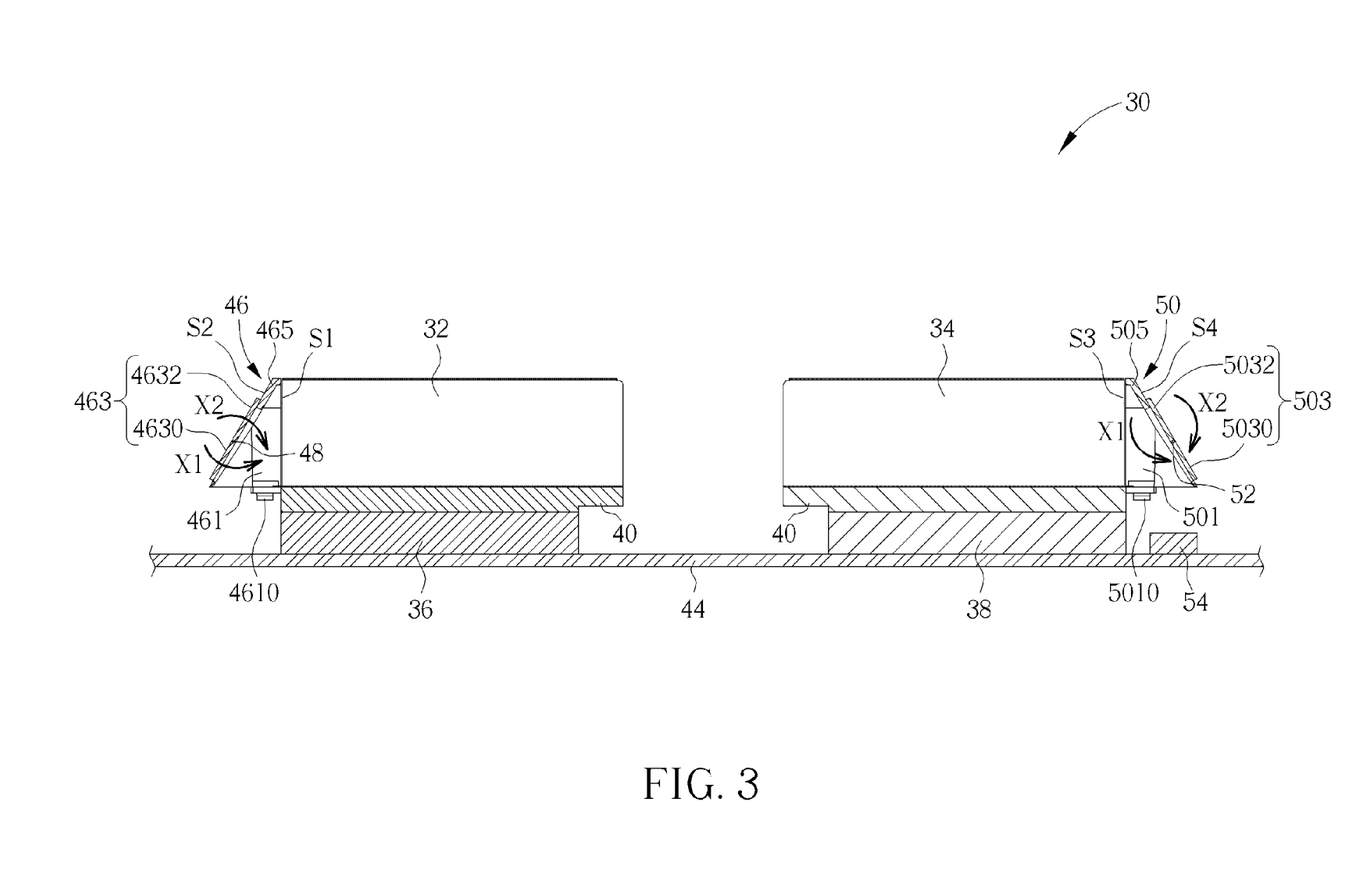
FIG. 3 is a sectional diagram of the heat dissipating module according to the first embodiment of the present invention.

Please refer to FIG. 1 to FIG. 3. FIG. 3 is a sectional diagram of the heat dissipating module 30 according to the first embodiment of the present invention. As shown in FIG. 1 to FIG. 3, the heat dissipating module 30 further includes a first air flow guiding mechanism 46 installed on the first side S1 of the first heat dissipating member 32. Furthermore, the first air flow guiding mechanism 46 includes a first base 461, a first air guiding plate 463 and a first stopping structure 465. The first base 461 is disposed on the first side S1 of the first heat dissipating member 32. The first air guiding plate 463 is pivoted to the first base 461. The first stopping structure 465 is disposed on the first base 461. In this embodiment, the first stopping structure 465 and the first base 461 can be, but not limited to, integrally formed. For example, the first stopping structure 465 and the first base 461 can be two separate parts as well, and the first stopping structure 465 can be combined with the first base 461 in a glued, an engaged or a screwing manner. As for which one of the aforesaid designs is adopted, it depends on practical demands.

Figure 4:
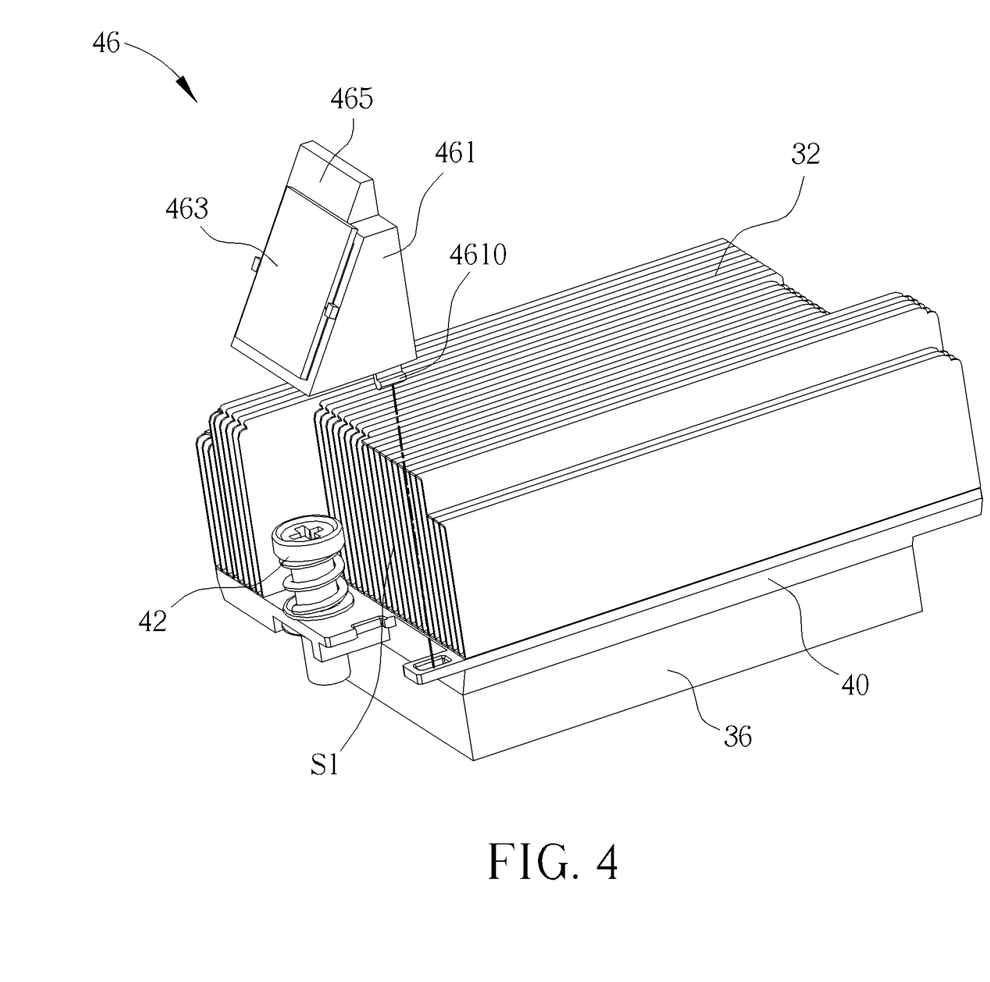
FIG. 4 is an exploded diagram of a first heat dissipating member and a first air flow guiding mechanism according to the first embodiment of the present invention.

Please refer to FIG. 4. FIG. 4 is an exploded diagram of the first heat dissipating member 32 and the first air flow guiding mechanism 46 according to the first embodiment of the present invention. As shown in FIG. 4, the first base 461 includes a first hook 4610 for hooking the first heat dissipating member 32, so as to fix the first base 461 onto the first heat dissipating member 32. In such a manner, the first heat dissipating member 32 can be combined with the first air flow guiding mechanism 46 as a single module. In other words, the assembly process on a production line can be facilitated by implementation of the single module of the first heat dissipating member 32 and the first air flow guiding mechanism 46 as mentioned above. Structures for fixing the first base 461 onto the first heat dissipating member 32 are not limited to those mentioned in this embodiment. For example, the first base 461 can be screwed onto the first heat dissipating member 32 as well. In other words, the structures capable of fixing the first base 461 onto the first heat dissipating member 32 are within the scope of the present invention.

As shown in FIG. 3, the first air guiding plate 463 includes a first air driven section 4630 and a second air driven section 4632. The first air flow guiding mechanism 46 of the heat dissipating module 30 further includes a first pivotal member 48 disposed at a joint where the first air driven section 4630 of the first air guiding plate 463 is combined with the second air driven section 4632 of the first air guiding plate 463 for pivoting the first air guiding plate 463 to the first base 461. In this embodiment, the first pivotal member 48 and the first air guiding plate 463 can be, but not limited to, integrally formed. For example, the first pivotal member 48 and the first air guiding plate 463 can be two separate parts as well. When assembling the first pivotal member 48 and the first air guiding plate 463, the first pivotal member 48 can be combined with the first air guiding plate 463 in a tight fit or in a glued manner. In other words, the structures of the first pivotal member 48 for pivoting the first air guiding plate 463 to the first base 461 are within the scope of the present invention. In practical application, the first air guiding plate 463 can be made of Nylon 66 materials.

In addition, a second side S2 of the first stopping structure 465 far from the first heat dissipating member 32 abuts against the second air driven section 4632 of the first air guiding plate 463, as shown in FIG. 3. When the first air guiding plate 463 pivots on the first pivotal member 48 in a first direction X1 (i.e. a counterclockwise direction), the first stopping structure 465 is incapable of stopping the first air guiding plate 463 from rotating. In other words, the first air guiding plate 463 is capable of freely rotating in the first direction X1. Conversely, when the first air guiding plate 463 pivots on the first pivotal member 48 in a second direction X2 opposite to the first direction X1 (i.e. a clockwise direction), the first stopping structure 465 is capable of stopping the second air driven section 4632 of the first air guiding plate 463. In other words, the first air guiding plate 463 is incapable of rotating in the second direction X2.

In other words, since the second side S2 of the first stopping structure 465 far from the first heat dissipating member 32 abuts against the second air driven section 4632 of the first air guiding plate 463, the first stopping structure 465 allows the first air guiding plate 463 to freely rotate in the first direction X1 and disallows the first air guiding plate 463 to rotate in the second direction X2, i.e. the first stopping structure 465 only allows an one-way rotation of the first air guiding plate 463.

As shown in FIG. 1 to FIG. 3, the heat dissipating module 30 further includes a second air flow guiding mechanism 50 installed on a third side S3 of the second heat dissipating member 34 far from the first side S1 of the first heat dissipating member 32. Furthermore, the second air flow guiding mechanism 50 includes a second base 501, a second air guiding plate 503 and a second stopping structure 505. The second base 501 is disposed on the third side S3 of the second heat dissipating member 34. The second air guiding plate 503 is pivoted to the second base 501. The second stopping structure 505 is disposed on the second base 501. In this embodiment, the second stopping structure 505 and the second base 501 can be, but not limited to, integrally formed. For example, the second stopping structure 505 and the second base 501 can be two separate parts as well, and the second stopping structure 505 can be combined with the second base 501 in a glued, an engaged or a screwing manner. As for which one of the aforesaid designs is adopted, it depends on practical demands.

Figure 5:
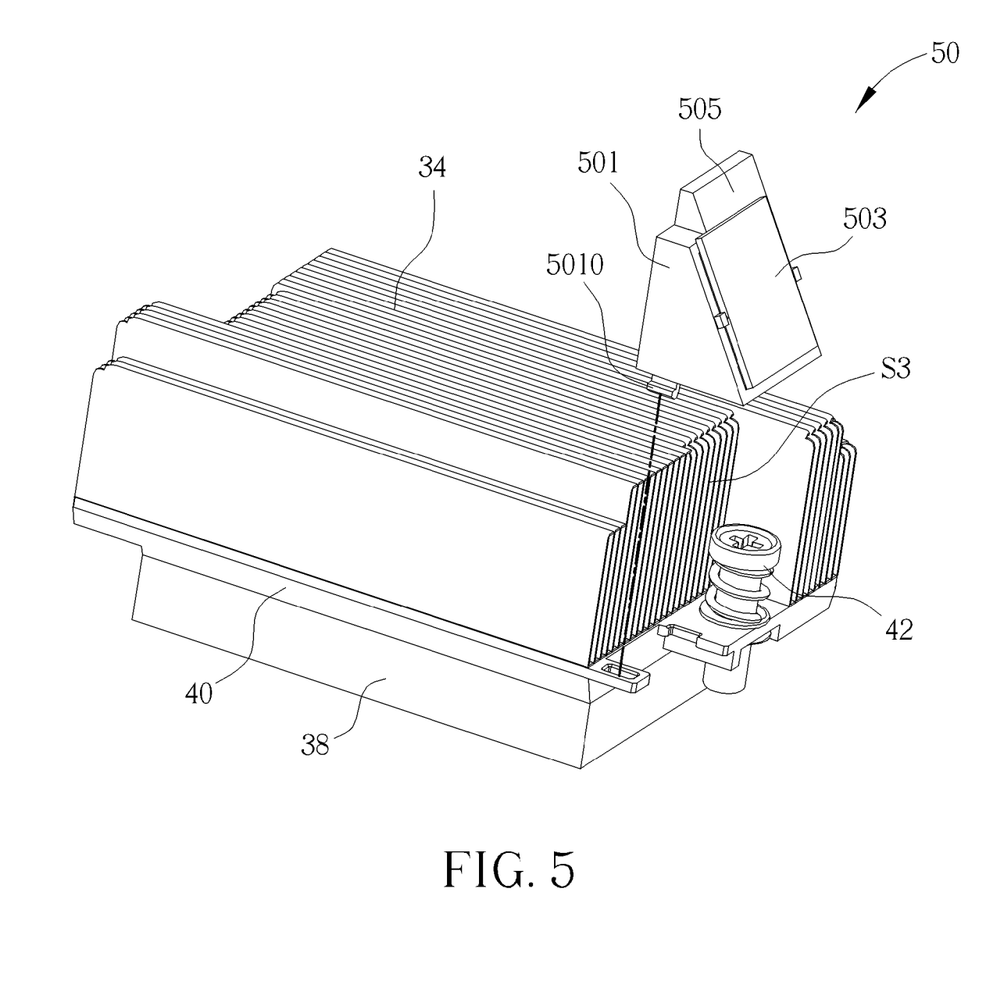
FIG. 5 is an exploded diagram of a second heat dissipating member and a second air flow guiding mechanism according to the first embodiment of the present invention.

Please refer to FIG. 5. FIG. 5 is an exploded diagram of the second heat dissipating member 34 and the second air flow guiding mechanism 50 according to the first embodiment of the present invention. As shown in FIG. 5, the second base 501 includes a second hook 5010 for hooking the second heat dissipating member 34, so as to fix the second base 501 onto the second heat dissipating member 34. In such a manner, the second heat dissipating member 34 can be combined with the second air flow guiding mechanism 50 as a single module. In other words, the assembly process on a production line can be facilitated by implementation of the single module of the second heat dissipating member 34 and the second air flow guiding mechanism 50 as mentioned above. Structures for fixing the second base 501 onto the second heat dissipating member 34 are not limited to those mentioned in this embodiment. For example, the second base 501 can be screwed onto the second heat dissipating member 34 as well. In other words, the structures capable of fixing the second base 501 onto the second heat dissipating member 34 are within the scope of the present invention.

As shown in FIG. 3, the second air guiding plate 503 includes a first air driven section 5030 and a second air driven section 5032. The second air flow guiding mechanism 50 of the heat dissipating module 30 further includes a second pivotal member 52 disposed at a joint where the first air driven section 5030 of the second air guiding plate 503 is combined with the second air driven section 5032 of the second air guiding plate 503 for pivoting the second air guiding plate 503 to the second base 501. In this embodiment, the second pivotal member 52 and the second air guiding plate 503 can be, but not limited to, integrally formed. For example, the second pivotal member 52 and the second air guiding plate 503 can be two separate parts as well. When assembling the second pivotal member 52 and second air guiding plate 503, the second pivotal member 52 can be combined with the second air guiding plate 503 in a tight fit or in a glued manner. In other words, the structures of the second pivotal member 52 for pivoting the second air guiding plate 503 to the second base 501 are within the scope of the present invention. In practical application, the second air guiding plate 503 can be made of Nylon 66 materials.

In addition, a fourth side S4 of the second stopping structure 505 far from the second heat dissipating member 34 abuts against the second air driven section 5032 of the second air guiding plate 503, as shown in FIG. 3. When the second air guiding plate 503 pivots on the second pivotal member 52 in the second direction X2 (i.e. the clockwise direction), the second stopping structure 505 is incapable of stopping the second air guiding plate 503 from rotating. In other words, the second air guiding plate 503 is capable of freely rotating in the second direction X2. Conversely, when the second air guiding plate 503 pivots on the second pivotal member 52 in the first direction X1 (i.e. the counterclockwise direction), the second stopping structure 505 is capable of stopping the second air driven section 5032 of the second air guiding plate 503. In other words, the second air guiding plate 503 is incapable of rotating in the first direction X1.

In other words, since the fourth side S4 of the second stopping structure 505 far from the second heat dissipating member 34 abuts against the second air driven section 5032 of the second air guiding plate 503, the second stopping structure 505 allows the second air guiding plate 503 to freely rotate in the second direction X2 and disallows the second air guiding plate 503 to rotate in the first direction X1, i.e. the second stopping structure 505 only allows an one-way rotation of the second air guiding plate 503.

Figure 6:
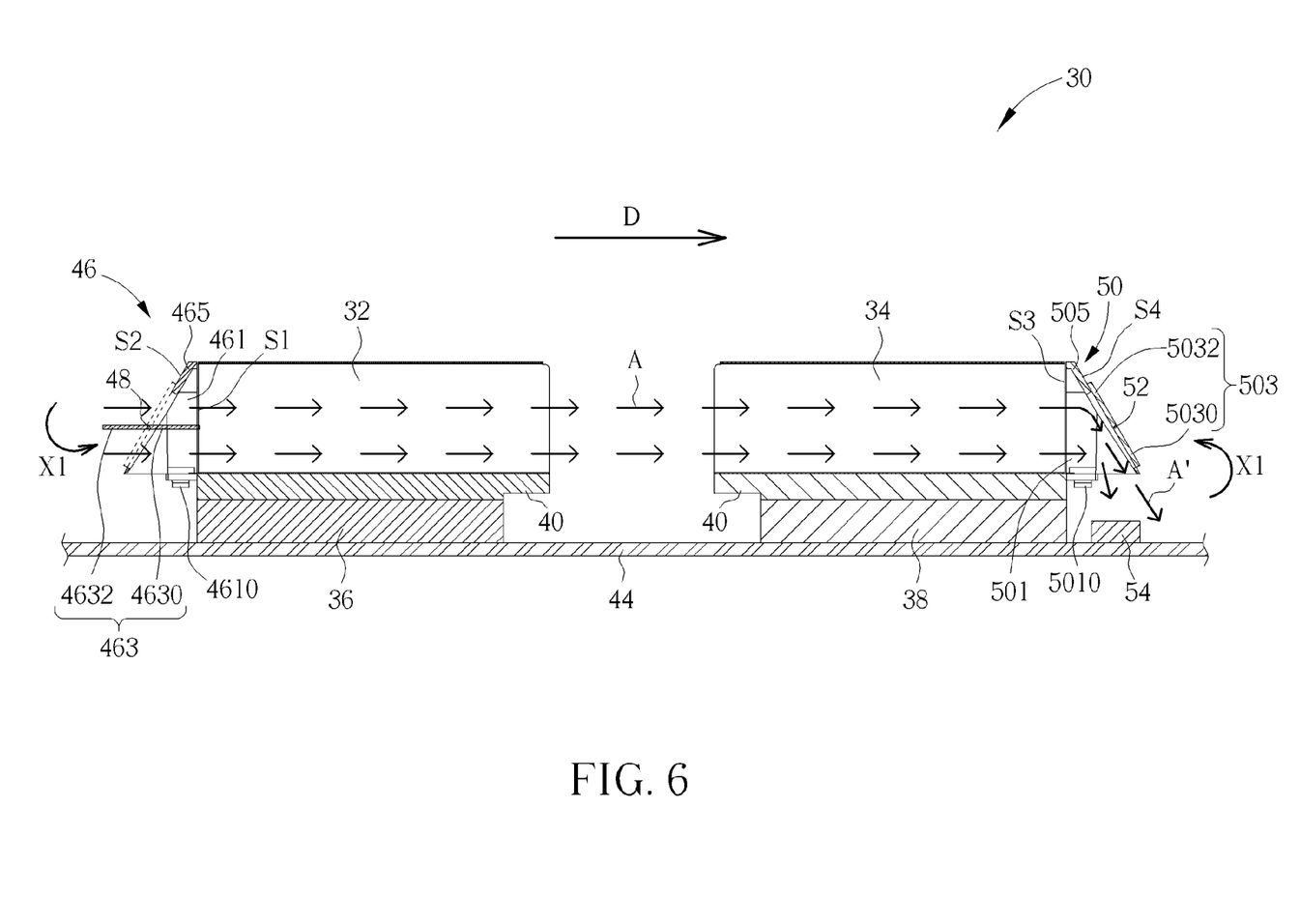
FIG. 6 is a sectional diagram of the heat dissipating module in a flow status according to the first embodiment of the present invention.

As shown in FIG. 1, when the fan 45 disposed on the circuit board 44 and located in the position corresponding to the first side S1 of the first heat dissipating member 32 is activated, the fan 45 can generate an air flow along a flow direction D, i.e. the air flow generated by the fan 45 passes through the heat dissipating module 30 in a direction from the first heat dissipating member 32 toward the second heat dissipating member 34. Please refer to FIG. 3 and FIG. 6. FIG. 6 is a sectional diagram of the heat dissipating module 30 in a flow status according to the first embodiment of the present invention. As shown in FIG. 3 and FIG. 6, when the air flow generated by the fan 45 achieves the first air flow guiding mechanism 46 along the flow direction D, the first air driven section 4630 of the first air guiding plate 463 is closer to the fan 45 than the second air driven section 4632 is and thus is driven by the air flow prior to the second air driven section 4632 since the first air guiding plate 463 slants and abuts against the first base 461, as shown in FIG. 3. Accordingly, a counterclockwise moment is applied on the first air guiding plate 463 relative to the first pivotal member 48 by the air flow, such that the first air guiding plate 463 possesses an angular momentum in the first direction X1. As a result, the first air guiding plate 463 will be rotated in the first direction X1.

In such a manner, the first air guiding plate 463 can be stayed in a position shown in FIG. 6. Accordingly, the air flow generated by the fan 45 can pass through the first heat dissipating member 32 and the second heat dissipating member 34 along an arrow direction A shown in FIG. 6 and then achieves the second air flow guiding mechanism 50. In practical application, a length of the first air driven section 4630 of the first air guiding plate 463 is greater than a length of the second air driven section 4632 of the first air guiding plate 463. In such a manner, the counterclockwise moment relative to the first pivotal member 48 and resulting from application of the air on the first air driven section 4630 of the first air guiding plate 463 is greater than the clockwise moment relative to the first pivotal member 48 and resulting from application of the air on the second air driven section 4632 of the first air guiding plate 463, so as to ensure the first air guiding plate 463 to rotate in the first direction X1 as flowed by the air flow.

When the air flow generated by the fan 45 passes through the first heat dissipating member 32 and the second heat dissipating member 34 and achieves the second air flow guiding mechanism 50, the second air guiding plate 503 can be stayed in a position shown in FIG. 6 since the second stopping structure 505 is capable of stopping the second air guiding plate 503 from rotating in the first direction X1. In other words, the air flow generated by the fan 45 will diverge due to obstruction of the second air guiding plate 503. In such a manner, the air flow generated by the fan 45 can achieve an electronic component 54 located underneath the second air flow guiding mechanism 50 in an arrow direction A' shown in FIG. 6, so as to enhance the heat dissipating efficiency for the electronic component 54.

In practical application, a length of the first air driven section 5030 of the second air guiding plate 503 is greater than a length of the second air driven section 5032 of the second air guiding plate 503. In such a manner, the counterclockwise moment relative to the second pivotal member 52 and resulting from application of the air on the first air driven section 5030 of the second air guiding plate 503 is greater than the clockwise moment relative to the second pivotal member 52 and resulting from application of the air on the second air driven section 5032 of the second air guiding plate 503, so as to ensure the second air guiding plate 503 to rotate in the first direction X1 as flowed by the air flow. Accordingly, the second air guiding plate 503 can continuously abut against the second stopping structure 505. In such a manner, the second air guiding plate 503 can be stably stayed in the position shown in FIG. 6 and thus diverge the air slow for enhancing the heat dissipating efficiency of the electronic component 54.

In practical application, the electronic component 54 can be an internal electronic component, such as an automatic voltage regulator, which located on a lee side of the second electronic component 38 relative to the fan 45. The first air flow guiding mechanism 46 and the second air flow guiding mechanism 50 of the heat dissipating module 30 of the present disclosure can guide the air flow generated by the fan 45 to the electronic component 54, so as to enhance the heat dissipating efficiency for the electronic component 54. In other words, the heat dissipating module 30 of the present disclosure can diverge the air flow generated by the fan 45 by the first air flow guiding mechanism 46 and the second air flow guiding mechanism 50, such that the air flow can achieve the electronic component 54 located on the lee side of the second electronic component 38, so as to enhance the heat dissipating efficiency for the electronic component 54. In this embodiment, the heat dissipating module 30 of the present disclosure can experimentally enhance the heat efficiency for the electronic component 54 located on the lee side of the second electronic component 38 by about 10 percents.

In this embodiment, the mechanism of the first air flow guiding mechanism 46 can be substantially identical to the mechanism of the second air flow guiding mechanism 50 for saving mold cost and further saving manufacture cost. Furthermore, as shown in FIG. 6, the first air flow guiding mechanism 46 is symmetric to the second air flow guiding mechanism 50. Accordingly, when the single module combined with the first heat dissipating member 32 and the first air flow guiding mechanism 46 as well as the single module combined with the second heat dissipating member 34 and the second air flow guiding mechanism 50 are reversely installed on the production line, i.e. when the single module combined with the first heat dissipating member 32 and the first air flow guiding mechanism 46 is misplaced with the single module combined with the second heat dissipating member 34 and the second air flow guiding mechanism 50 on the production line, the first air flow guiding mechanism 46 and the second air flow guiding mechanism 50 of the heat dissipating module 30 of the present disclosure can still guide the air flow generated by the fan 45 to the electronic component 54 duo to identical mechanisms and symmetric dispositions of the first air flow guiding mechanism 46 and the second air flow guiding mechanism 50, so as to enhance the heat dissipating efficiency for the electronic component 54.

In summary, the heat dissipating module 30 of the present disclosure can solve the issue of reverse installation due to carelessness on the production line. In other words, the heat dissipating module 30 of the present disclosure can improve the issue of lacking for compatibility of the conventional air guiding plate with fixed structural design in the prior art, so as to advantage manufacture.

Figure 7:
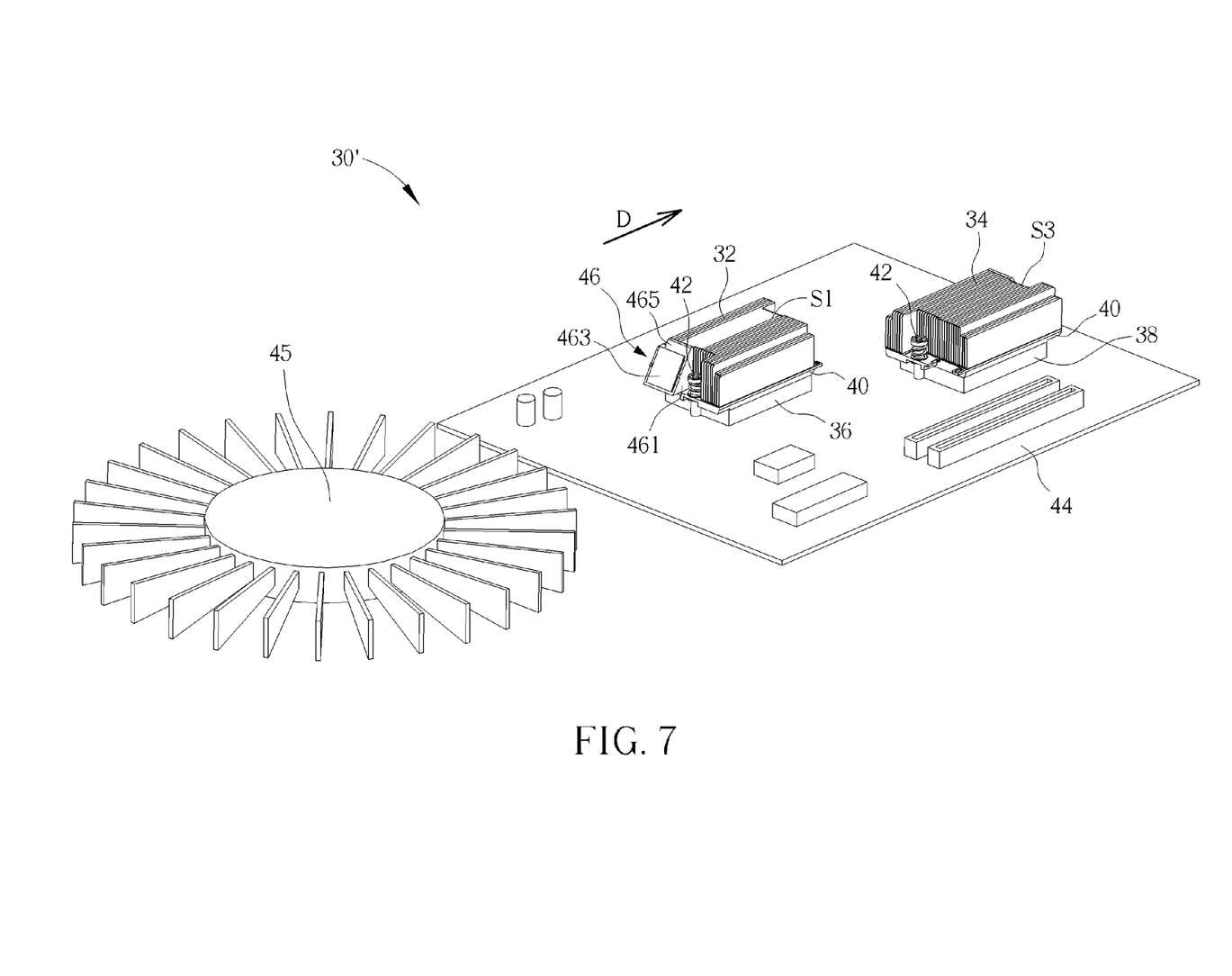
FIG. 7 is a diagram of a heat dissipating module according to a second embodiment of the present invention.

Please refer to FIG. 1 and FIG. 7. FIG. 7 is a diagram of a heat dissipating module 30' according to a second embodiment of the present invention. As shown in FIG. 1 and FIG. 7, the major difference between the heat dissipating module 30' and the aforesaid heat dissipating module 30 is that the second heat dissipating member 34 of the heat dissipating module 30' is not aligned with the first heat dissipating member 32 of the heat dissipating module 30'. Similarly, the heat dissipating module 30' can still diverge the air flow generated by the fan 45 by the first air flow guiding mechanism 46 and the second air flow guiding mechanism 50, such that the air flow can achieve the electronic component located on the lee side of the second electronic component 38 for enhancing the heat dissipating efficiency for the electronic component. Furthermore, the heat dissipating module 30' of the present disclosure can solve the issue of reverse installation due to carelessness on the production line as well. The components in this embodiment with denotes identical to those in the aforesaid embodiment have identical structures and principles, and further description is omitted herein for simplicity.

Compared to the prior art, by a structural design that the side of the first stopping structure far from the first heat dissipating member abuts against the second air driven section of the first air guiding plate, the first air guiding plate of the present disclosure is capable of freely rotating in the first direction and incapable of rotating in the second direction. By a structural design that the side of the second stopping structure far from the second heat dissipating member abuts against the second air driven section of the second air guiding plate, the second air guiding plate of the present disclosure is capable of freely rotating in the second direction and incapable of rotating in the first direction. When air emitted from a fan passes the heat dissipating module of the present disclosure in a direction from the first heat dissipating member toward the second heat dissipating member, the first air guiding plate is rotated in the first direction, such that the air passes through the first air guiding plate and achieves the second air guiding plate. Additionally, since the second air guiding plate is incapable of rotating in the first direction, the air can not pass through the second air guiding plate and thus is guided to an electronic component disposed underneath the second air guiding mechanism, i.e. on a lee side of another electronic component relative to the fan, so as to enhance the heat dissipating efficiency. In addition, the first air guiding mechanism is identical to and symmetrically disposed relative to the second air guiding mechanism. Thus, the heat dissipating module of the present disclosure can improve the issue of lacking for compatibility of the conventional air guiding plate with fixed structural design in the prior art, so as to advantage manufacture.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating module capable of enhancing heat dissipating efficiency, the heat dissipating module comprising:
   a first heat dissipating member;
   a second heat dissipating member aligned with the first heat dissipating member;
   a first air flow guiding mechanism comprising:
      a first base disposed on a side of the first heat dissipating member opposite from the second heat dissipating member;
      a first air guiding plate pivoted to the first base; and
      a first stopping structure disposed on the first base, a side of the first stopping structure abutting against the first air guiding plate, so as to allow the first air guiding plate to rotate in a first direction and to prevent the first air guiding plate from rotating in a second direction opposite to the first direction; and
   a second air flow guiding mechanism comprising:
      a second base disposed on a side of the second heat dissipating member opposite from the first heat dissipating member;
      a second air guiding plate pivoted to the second base; and
      a second stopping structure disposed on the second base, a side of the second stopping structure abutting against the second air guiding plate, so as to allow the second air guiding plate to rotate in a second direction and to prevent the second air guiding plate from rotating in the first direction.

2. The heat dissipating module of claim 1, wherein a side of the first stopping structure away from the first heat dissipating member abuts against the second air driven section of the first air guiding plate, and a side of the second stopping structure away from the second heat dissipating member abuts against the second air driven section of the second air guiding plate.

3. The heat dissipating module of claim 2, wherein a length of the first air driven section along a longitudinal direction of the first air guiding plate is greater than a length of the second air driven section along a longitudinal direction of the second air guiding plate.

4. The heat dissipating module of claim 1, wherein the first pivotal member and the first air guiding plate are integrally formed, and the second pivotal member and the second air guiding plate are integrally formed.

5. The heat dissipating module of claim 1, wherein the first base comprises a first hook for hooking the first heat dissipating member, and the second base comprises a second hook for hooking the second heat dissipating member.

6. The heat dissipating module of claim 5, further comprising:
a screw component for respectively screwing the first heat dissipating member and the second heat dissipating member onto a circuit board.

7. The heat dissipating module of claim 5, further comprising:
a fixing plate for respectively fixing the first heat dissipating member and the second heat dissipating member onto a corresponding electronic component.

8. The heat dissipating module of claim 1, wherein the first heat dissipating member and the second heat dissipating member are respectively a thermal fin.

9. The heat dissipating module of claim 1, wherein the first air guiding plate and the second air guiding plate are respectively made of Nylon 66 materials.

10. The heat dissipating module of claim 1, wherein the first air guiding plate and the second air guiding plate are respectively made of Nylon 66 materials.

11. A heat dissipating module capable of enhancing heat dissipating efficiency, the heat dissipating module comprising:
a first heat dissipating member;
a second heat dissipating member not aligned with the first heat dissipating member;
a first air flow guiding mechanism comprising:
a first base disposed on a side of the first heat dissipating member opposite from the second heat dissipating member;
a first air guiding plate pivoted to the first base; and
a first stopping structure disposed on the first base, a side of the first stopping structure abutting against the first air guiding plate, so as to allow the first air guiding plate to rotate in a first direction and to prevent the first air guiding plate from rotating in a second direction opposite to the first direction; and
a second air flow guiding mechanism comprising:
a second base disposed on a side of the second heat dissipating member opposite from the first heat dissipating member;
a second air guiding plate pivoted to the second base; and
a second stopping structure disposed on the second base, a side of the second stopping structure abutting against the second air guiding plate, so as to allow the second air guiding plate to rotate in a second direction and to prevent the second air guiding plate from rotating in the first direction.

12. The heat dissipating module of claim 11, wherein a side of the first stopping structure away from the first heat dissipating member abuts against the second air driven section of the first air guiding plate, and a side of the second stopping structure away from the second heat dissipating member abuts against the second air driven section of the second air guiding plate.

13. The heat dissipating module of claim 12, wherein a length of the first air driven section along a longitudinal direction of the first air guiding plate is greater than a length of the second air driven section along a longitudinal direction of the second air guiding plate.

14. The heat dissipating module of claim 11, wherein the first pivotal member and the first air guiding plate are integrally formed, and the second pivotal member and the second air guiding plate are integrally formed.

15. The heat dissipating module of claim 11, wherein the first base comprises a first hook for hooking the first heat dissipating member, and the second base comprises a second hook for hooking the second heat dissipating member.

16. The heat dissipating module of claim 15, further comprising:
a screw component for respectively screwing the first heat dissipating member and the second heat dissipating member onto a circuit board.

17. The heat dissipating module of claim 15, further comprising:
a fixing plate for respectively fixing the first heat dissipating member and the second heat dissipating member onto a corresponding electronic component.

18. The heat dissipating module of claim 11, wherein the first heat dissipating member and the second heat dissipating member are respectively a thermal fin.

* * * * *